United States Patent
Ishida et al.

(10) Patent No.: US 6,642,134 B2
(45) Date of Patent: *Nov. 4, 2003

(54) SEMICONDUCTOR PROCESSING EMPLOYING A SEMICONDUCTOR SPACER

(75) Inventors: Emi Ishida, Sunnyvale, CA (US); Scott Luning, San Francisco, CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 19 days.

(21) Appl. No.: 09/401,797

(22) Filed: Sep. 22, 1999

(65) Prior Publication Data

US 2003/0170969 A1 Sep. 11, 2003

(51) Int. Cl.$^7$ .......................................... H01L 21/3205
(52) U.S. Cl. ...................... 438/596; 438/304; 438/564; 438/542; 438/558; 438/683
(58) Field of Search ................................ 438/304, 564, 438/596, 542, 558, 301, 305, 683, 682

(56) References Cited

U.S. PATENT DOCUMENTS

| 5,407,847 | A | * | 4/1995 | Hayden et al. | ............... 438/305 |
| 5,710,054 | A | * | 1/1998 | Gardner et al. | ............. 438/304 |
| 5,759,885 | A | * | 6/1998 | Son | ............................ 438/230 |
| 5,824,586 | A | * | 10/1998 | Wollesen et al. | ........... 438/300 |
| 6,037,232 | A | * | 3/2000 | Wieczorek et al. | ......... 438/302 |
| 6,165,900 | A | * | 12/2000 | Kim et al. | ................... 438/649 |
| 6,180,477 | B1 | * | 1/2001 | Liao | ............................ 438/305 |

* cited by examiner

Primary Examiner—Amir Zarabian
Assistant Examiner—Christy Novacek

(57) ABSTRACT

A semiconductor device is provided with semiconducting sidewall spacers used in the formation of source/drain regions. The semiconducting sidewall spacers also reduce the possibility of suicide shorting through shallow source/drain junctions. Embodiments include doping the semiconducting sidewall spacers so that they serve as a source of impurities for forming source/drain extensions during activation annealing.

12 Claims, 5 Drawing Sheets

SEMICONDUCTOR PROCESSING EMPLOYING A SEMICONDUCTOR SPACER

TECHNICAL FIELD

The present invention relates to a semiconductor device and to a method of manufacturing a semiconductor device. The present invention has particular applicability in manufacturing high density CMOS semiconductor devices with design features of 0.25 microns and under.

BACKGROUND ART

The escalating requirements for high densification and performance associated with ultra large scale integration semiconductor devices require design features of 0.25 microns and under, such as 0.18 microns and under, increased transistor and circuit speeds, high reliability and increased manufacturing throughput. The reduction of design features to 0.25 microns and under challenges the limitations of conventional semiconductor manufacturing techniques.

As device features continually shrink in size, it becomes necessary to decrease the depth of the source/drain regions in the semiconductor substrate, i.e., the junction depth. For example, in forming a polycrystalline silicon gate having a width of about 0.25 microns, the junction depth ($X_j$) should be no greater than about 2000 Å.

In conventional semiconductor methodology illustrated in FIG. 1, an initial gate dielectric layer 12, such as silicon oxide, is formed on semiconductor substrate 10 and a gate electrode layer formed thereon as in conventional practices. The gate electrode layer, typically doped polysilicon, is etched in a conventional manner to form a gate electrode 14 on underlying gate oxide layer 12.

Next insulating sidewall spacers 16 are formed on each side surface of get electrode 14 and underlying dielectric layer 12 adjacent gate electrode 14 side surfaces, as shown in FIG. 2. Sidewall spacers 16 are formed by depositing a layer of dielectric material, such as a silicon nitride or silicon oxide, and anisotropically etching, thereby exposing the surface of semiconductor substrate 10 adjacent sidewall spacers 16. Subsequently, using gate electrode 14 and sidewall spacers 16 as a mask, impurities are ion implanted, as indicated by arrows 19 in FIG. 2, to form source/drain implants 18. Next, activation annealing is performed to form source/drain regions in substrate 10.

A metal, such as titanium, is then sputtered across the semiconductor. A low temperature anneal follows to create a high-resistivity titanium silicide ($TiSi_x$) on the exposed silicon of gate electrode 14 and over source/drain regions 18. The unreacted titanium over spacers 16 is then removed, followed by a high temperature anneal to form a low-resistivity $TiSi_x$, as indicated by XXX's in FIG. 2.

A drawback attendant upon the formation of the titanium silicide is that silicon in semiconductor substrate 10 is consumed in the titanium-silicon reaction This, combined with the shallow junctions depths desired in semiconductor devices having design features of 0.25 microns and under, can lead to the suicide shorting through source/drain junctions 18. When such shorting occurs, circuit reliability is adversely affected, possibly leading to circuit failure.

SUMMARY OF THE INVENTION

There exists a need for a method of manufacturing a CMOS device which avoids suicide shorting through the source/drain junctions.

There is also a need for a semiconductor device with increased reliability.

Additional advantages and other features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

According to the present invention, the foregoing and other advantages are achieved in part by a semiconductor device including a semiconductor substrate and a dielectric layer formed on the semiconductor substrate. The semiconductor device also includes a gate electrode having an upper surface and side surfaces formed on the dielectric layer and first sidewall spacers formed on the side surfaces of the gate electrode. The semiconductor device further includes second sidewall spacers comprising a semiconducting material that are formed on the first sidewall spacers.

Another aspect of the present invention is a method of manufacturing a semiconductor device. The method includes forming a dielectric layer on a surface of a semiconductor substrate and forming a conductive layer on the dielectric layer. The method also includes patterning the conductive layer to form a gate electrode having an upper surface and side surfaces, depositing an insulating layer and etching the insulating layer to form first sidewall spacers on the side surfaces of the gate electrode. The method further includes depositing a semiconducting layer and etching the semiconducting layer to form second sidewall spacers on the first sidewall spacers.

Other advantages and features of the present invention will become readily apparent to those skilled in this art from the following detailed description. The preferred embodiments shown and described provide illustration of the best mode contemplated for carrying out the invention. The invention is capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout.

DESCRIPTION OF THE INVENTION

Figure 1:
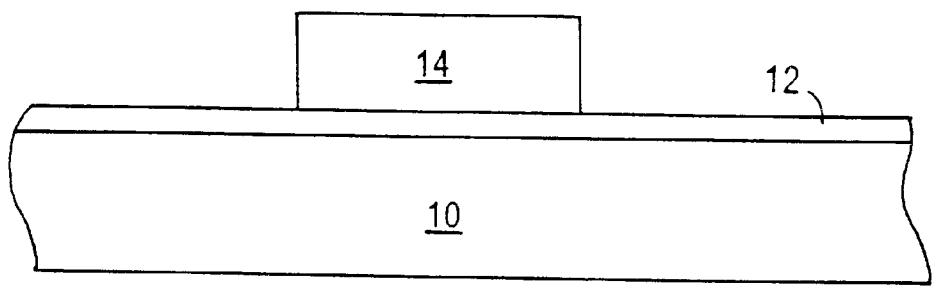
FIG. 1 illustrates the formation of a gate electrode according to conventional methodology.
Figure 2:
FIG. 2 illustrates the formation of source/drain implants and titanium suicide according to conventional methodology.
Figure 2:
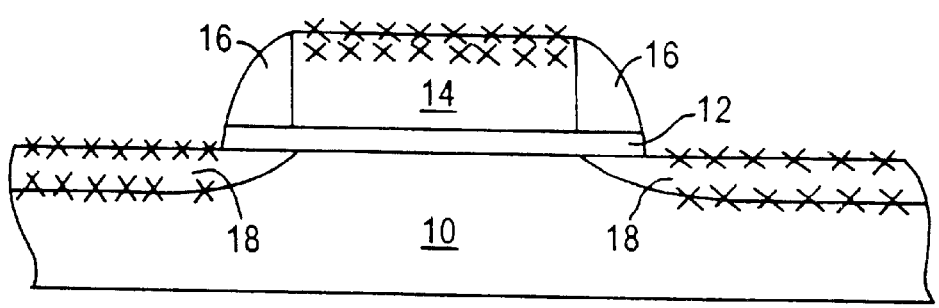
Figure 3:
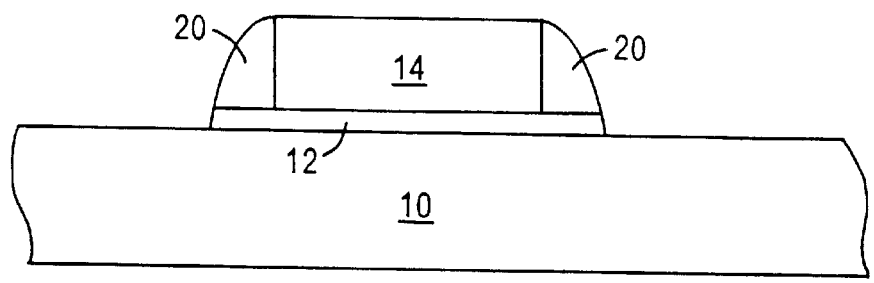
FIG. 3 illustrates the formation of sidewall spacers according to an embodiment of the present

The present invention addresses and solves the problem of silicide shorting through source/drain junctions, thereby enabling the formation of transistors with shallow source/drain junctions and increased An embodiment of the present invention is illustrated in FIG. 3, wherein an initial gate dielectric layer 12, such as a silicon oxide, is formed on semiconductor substrate 10, typically monocrystalline silicon. A conductive layer, e.g., doped polycrystalline silicon, is deposited on gate oxide layer 12 and patterned in a conventional manner to form gate electrode 14.

Next, insulating sidewall spacers are formed on the side surfaces of gate electrode 14. A layer of insulating material, such as a silicon oxide, a silicon nitride or a silicon oxynitride is deposited, e.g., by chemical vapor deposition (CVD), followed by anisotropic etching to form first sidewall spacers 20 on the side surfaces of gate electrode 14 and on the portion of gate oxide layer 12 adjacent gate electrode 14. In forming sidewall spacers 20, gate oxide layer 12 is etched, thereby exposing the surface of semiconductor substrate 10 adjacent sidewall spacers 20, as shown in FIG. 3. The width of sidewall spacers 20 is chosen based on the particular circuit requirements. For example, it has been found suitable to deposit the layer of insulating material such that, after anisotropic etching, first sidewall spacers 20 have a width of about 200 Å to about 1500 Å.

Figure 4:
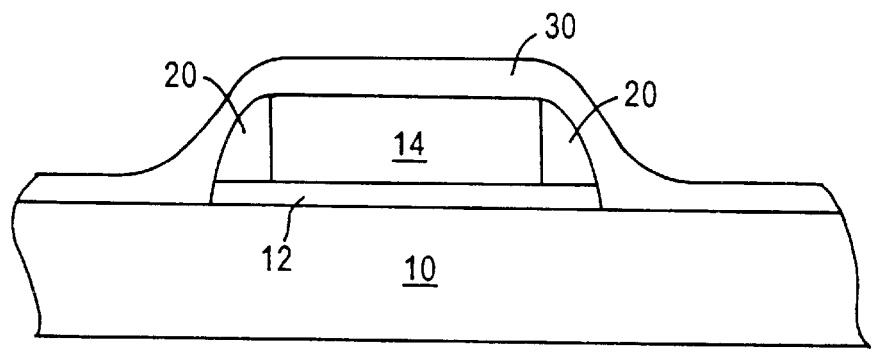
FIG. 4 illustrates the deposition of a semiconducting layer according to an embodiment of the present invention.

The present invention departs from conventional methodology by depositing a layer of semiconducting material to form second sidewall spacers on the first sidewall spacers 20. Adverting to FIG. 4, a layer of semiconducting material 30, such as polysilicon or amorphous silicon, is deposited, e.g., by chemical vapor deposition (CVD), for subsequently forming second sidewall spacers. Alternatively, another semiconducting material, such as a germanium or a silicon-germanium compound, can be deposited to ultimately serve as the second sidewall spacers.

In accordance with an embodiment of the present invention, semiconducting layer 30 is doped with impurities during deposition to serve as a source of impurities for subsequently forming source/drain (S/D) extensions in substrate 10 by diffusion. For example, a dopant can be introduced during CVD so that the deposited semiconducting layer 30 contains the desired impurities.

The particular dopant is chosen depending upon whether an N-channel MOSFET or P-channel MOSFET is to be formed. For an N-channel MOSFET, an N-type impurity, such as arsenic or phosphorous, is introduced into the CVD process. Similarly, for a P-channel MOSFET, a P-type impurity, such as boron, is introduced into the CVD process. Semiconducting layer 30 is then deposited with the desired impurities. Given the objectives disclosed herein, the particular concentrations of dopants can be optimized in a particular situation to form junctions having the desired impurity concentrations.

Figure 5:
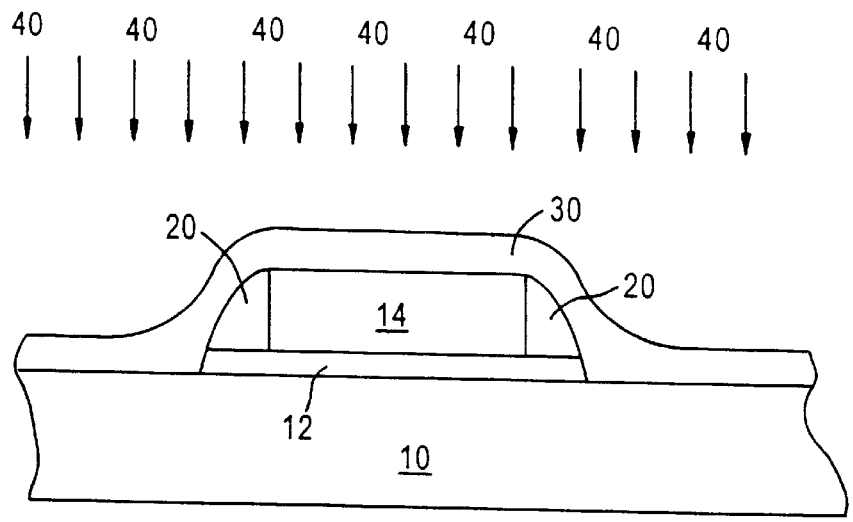
FIG. 5 illustrates doping the semiconducting layer of FIG. 4 according to an embodiment of the present invention.

In accordance with another embodiment of the present invention, semiconducting layer 30 is deposited as discussed previously, e.g., by CVD, after the formation of sidewall spacers 20. However, a dopant is not introduced during CVD to dope semiconducting layer 30 on deposition. Instead, semiconducting layer 30 is doped by ion implanting impurities after the deposition. Adverting to FIG. 5, impurities are ion implanted as indicated by arrows 40, to dope semiconducting layer 30. The particular impurity employed depends upon whether an N-channel MOSFET or P-channel MOSFET is to be formed.

For example, N-type impurities, such as arsenic or phosphorous, can be implanted at a dosage of about $1 \times 10^{15}$ atoms/cm$^2$ to about $2 \times 10^{16}$ atoms/cm$^2$ and an implantation energy of about 10 KeV to about 100 KeV to dope semiconducting layer 30. Alternatively, P-type impurities, such as boron, can be implanted at a dosage of about $1 \times 10^{15}$ atoms/cm$^2$ to about $2 \times 10^{16}$ atoms/cm$^2$ and an implantation energy of about 5 KeV to about 20 KeV to dope semiconducting layer 30. Given the objectives disclosed herein, the particular implantation dosage and energy can be optimized in a particular situation to form junctions having the desired impurity concentrations.

Figure 6:
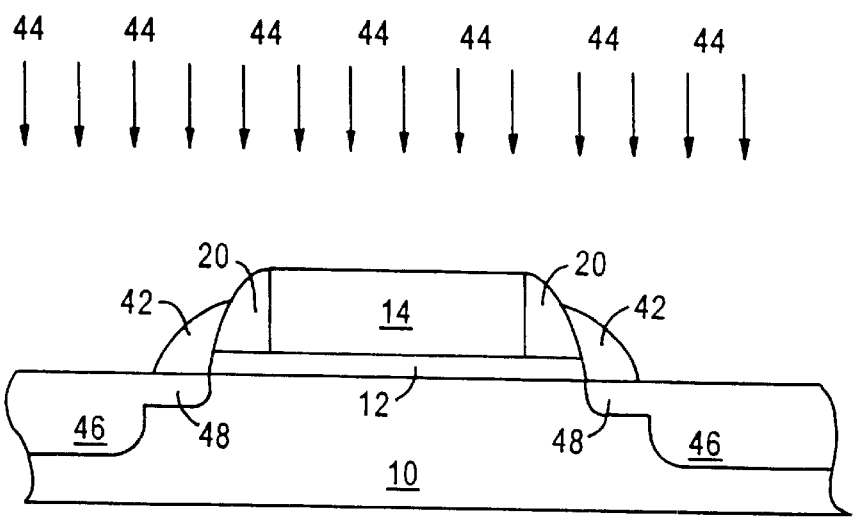
FIG. 6 illustrates implanting impurities to form source/drain regions according to an embodiment of the present invention.

Adverting to FIG. 6, doped semiconducting layer 30, i.e., doped during deposition or by ion implantation, is anisotropically etched to form second sidewall spacers 42. The width of sidewall spacers 42 is chosen based on the particular circuit requirements. For example, it has been found suitable to deposit semiconducting layer 30 at a thickness such that second sidewall spacers 42 have a width of about 50 Å to about 500 Å.

Impurities are then ion implanted, as indicated by arrows 44, using gate electrode 14, first sidewall spacers 20 and second sidewall spacers 42 as a mask, to form moderately-doped source/drain (MDD) implants or heavily-doped source/drain (HDD) implants 46. The particular implantation dosage and energy can be optimized to form the source/drain implants having the desired impurity concentrations based on the particular device requirements.

Activation annealing is then conducted, such as rapid thermal annealing (RTA) at a temperature of about 900° C. to about 1100° C. for about one second to about 45 seconds, e.g., about 30 seconds, to activate MDD/HDD implants 46 and form source/drain regions in semiconductor substrate 10. Advantageously, during activation annealing, doped sidewall spacers 42 act as a solid dopant source to form source/drain extensions 48. That is, during activation annealing, impurities from second sidewall spacers 42 diffuse into substrate 10, to form shallow S/D extensions 48, as shown in FIG. 6.

Adverting to FIG. 6, after activation annealing, the resulting source/drain profile comprises S/D extensions 48 extending to a first depth below substrate 10 and MDD/HDD regions 46 extending to a second depth, below the first depth. The combined source/drain regions 46 and 48 are desirably shallow close to the gate electrode 14, i.e., at S/D extension regions 48, and deeper away from gate electrode 14, i.e., at MDD/HDD regions 46.

Figure 7:
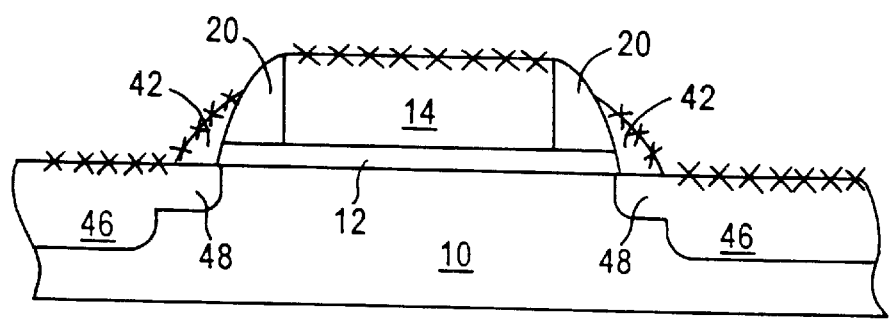
FIG. 7 illustrates the formation of titanium suicide on the device of FIG. 6.

Adverting to FIG. 7, after forming source/drain regions 46 and 48, a metal, such as titanium, is deposited, e.g., by sputter deposition. Alternatively, another metal, such as cobalt, can be sputter deposited. A low temperature anneal, such as RTA, is then conducted to create a high-resistivity titanium silicide (TiSi$_x$) on the exposed silicon of gate electrode 14, second spacer 42 and over source/drain regions 46, but not on spacer 20, typically an oxide. Unreacted titanium, e.g., over spacer 20, is then removed, e.g., by a wet strip. Next, a high temperature anneal, such as RTA at a temperature of about 400° C. to about 900° C. for about five seconds to about 60 seconds, is performed to form a low-resistivity TiSi$_x$, as indicated by XXX's in FIG. 7.

During the reaction to form the titanium silicide, silicon in sidewall spacers 42 is consumed. Advantageously, silicon consumption of sidewall spacers 42 prevents silicon consumption in substrate 10 above the shallow S/D implants 48, thereby preventing the silicide from shorting through the shallow junctions.

Figure 8:
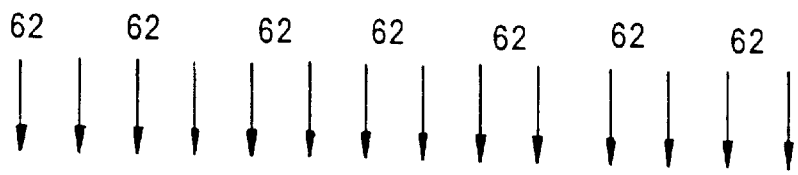
FIG. 8 illustrates the formation of source/drain regions according to an embodiment of the present invention.
Figure 8:
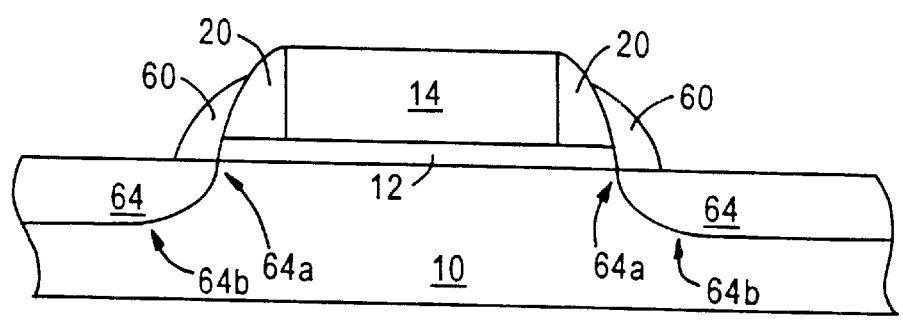

In accordance with another embodiment of the invention illustrated in FIG. 8, a layer of semiconducting material, such as silicon or a silicon-germanium compound, is deposited, e.g., by CVD, after the formation of sidewall spacers 20, as discussed previously. However, the semiconducting material is not doped with either N-type or P-type impurities. Instead, the semiconducting layer is etched, either anisotropically or via a combination of isotropic and anisotropic etching, to form second sidewall spacers 60.

Subsequently, impurities are ion implanted, as indicated by arrows 62 in FIG. 8, using gate electrode 14, first sidewall spacers 20 and second sidewall spacers 60 as a mask, to form source/drain regions 64. For example, N-type impurities, such as arsenic or phosphorous, can be implanted at a dosage of about $5 \times 10^{14}$ atoms/cm$^2$ to about $5 \times 10^{15}$ atoms/cm$^2$ and an implantation energy of about 1 KeV to about 60 KeV to form source/drain regions 64. Alternatively, P-type impurities, such as boron, can be implanted at a dosage of about $5 \times 10^{14}$ atoms/cm$^2$ to about $5 \times 10^{15}$ atoms/cm$^2$ and an implantation energy of about 1 KeV to about 40 KeV to form source/drain regions 64.

The resulting profile of source drain regions 64 is graded, due to the decreasing height of the combined mask of sidewall spacers 20 and 60 above the substrate progressing away from gate electrode 14. Essentially, the depth of impurity penetration into substrate 10 is inversely proportional to the height of the sidewall mask. That is, the higher the mask above the substrate, the shallower the penetration of impurities into substrate 10.

For example, beneath sidewall spacers 20, height of the mask is sufficiently high above the substrate to prevent impurity penetration therein. However, beneath sidewall spacers 60 at location 64a, the height of the mask above. the substrate is less, thereby allowing shallow impurity penetration into substrate 10. The depth of source/drain regions 64 slopes to its greatest depth at location 64b, where there is no mask above substrate 10.

The resulting profile of source/drain regions 64 is desirably shallow close to gate electrode 14 and progresses deeper away from gate electrode 14. Activation annealing is then conducted, such as rapid thermal annealing (RTA) at a temperature of about 900° C. to about 1100° C. for about one second to about 45 seconds, e.g., about 30 seconds, to activate source/drain implants 64 to form source/drain regions in semiconductor substrate 10.

Advantageously, source/drain regions 64 are formed with the desired profile in a single ion implantation step. This is in contrast to conventional methodology which requires two or more ion implantation steps to form source/drain regions having the desired profile. Thus, the present invention reduces the number of manipulative steps thereby increasing, manufacturing throughput.

Figure 9:
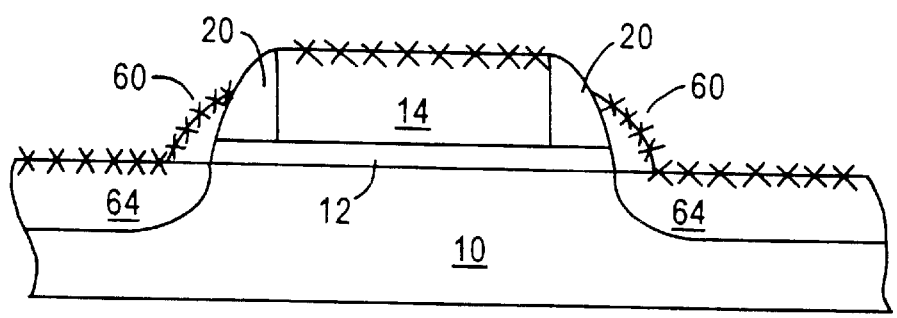
FIG. 9 illustrates the formation of titanium silicide on the device of FIG. 8.

Adverting to FIG. 9, after the formation of source/drain regions 64, a metal, such as titanium is deposited, e.g., by sputter deposition. Alternatively, another metal, such as cobalt, is sputter deposited. A low temperature anneal, such as RTA, follows to form a high-resistivity titanium silicide (TiSi$_x$) on the exposed silicon of gate electrode 14, second spacer 60 and over source/drain regions 64, but not on spacer 20, typically an oxide. Unreacted titanium, e.g., over spacer 20, is then removed, e.g., by a wet strip. Next, a high temperature anneal, such as RTA at a temperature of about 400° C. to about 900° C. for about five seconds to about 60 seconds, is performed to form a low-resistivity TiSi$_x$, as indicated by XXX's in FIG. 9.

During the reaction to form the titanium silicide, silicon in sidewall spacers 60 is consumed. Advantageously, silicon consumption of sidewall spacers 60 prevents silicon consumption in substrate 10 above shallow regions of source/drain regions 64, i.e, between location 64a and 64b, thereby preventing the silicide from shorting through the source/drain junctions.

Thus, in accordance with the present invention, the reliability of the transistor is improved by forming a semiconducting sidewall spacer. Advantageously, the semiconducting sidewall spacers prevent or substantially reduce the likelihood of silicide shorting through shallow source/drain junctions, thereby increasing device reliability. The present invention is applicable to the production of various types of semiconductor devices, particularly high density semiconductor devices with submicron features of about 0.25 microns and below, exhibiting high speed characteristics and improved reliability.

In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail, in order not to unnecessarily obscure the present invention.

Only the preferred embodiments of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a CMOS semiconductor device, which method comprises:

forming a dielectric layer on a surface of a semiconductor substrate;

forming a conductive layer on the dielectric layer;

patterning the conductive layer to form a gate electrode having an upper surface and side surfaces;

depositing an insulating layer;

etching the insulating layer to form first sidewall spacers on the side surfaces of the gate electrode;

depositing a semiconducting layer;

etching the semiconducting layer to form second sidewall spacers on the first sidewall spacers;

depositing a metal on the first and second sidewall spacers, the gate electrode, and the surface of the semiconductor substrate; and annealing to form silicide on the gate electrode, the second sidewall spacers and the semiconductor substrate, the second sidewall spacers being at least partially consumed during the annealing and substantially preventing silicon consumption in the semiconductor substrate below the second sidewall spacers.

2. The method of claim 1, wherein the semiconducting layer comprises silicon or germanium.

3. The method of claim 2, comprising:

doping the semiconducting layer before etching the semiconductor layer.

4. The method of claim 3, comprising:

implanting N-type or P-type impurities to dope the semiconducting layer.

5. The method of claim 4, comprising:

implanting N-type impurities at an implantation dosage of about $1 \times 10^{15}$ atoms/cm$^2$ to about $2 \times 10^{16}$ atoms/cm$^2$ and an implantation energy of about 10 KeV to about 100 KeV to dope the semiconducting layer.

6. The method of claim 4, comprising:

implanting P-type impurities at an implantation dosage of about $1 \times 10^{15}$ atoms/cm$^2$ to about $2 \times 10^{16}$ atoms/cm$^2$ and an implantation energy of about 5 KeV to about 20 KeV to dope the semiconducting layer.

7. The method of claim 4, comprising:

implanting N-type or P-type impurities, using the gate electrode and the first and second sidewall spacers as a mask to form source/drain implants of an N-channel transistor or a P-channel transistor, respectively.

8. The method of claim 7, comprising:

activation annealing to activate the source/drain implants and to diffuse a portion of the N-type or P-type impurities from the second sidewall spacers into the semiconductor substrate, forming source/drain junctions having a source/drain extension region extending to a first depth below the surface of the semiconductor substrate and a moderately or heavily doped source/drain region extending to a second depth, wherein the second depth is greater than the first depth.

9. The method of claim 2, comprising:

depositing the semiconductor layer comprising a semiconducting material containing N-type impurities or P-type impurities.

10. The method of claim 2, comprising:

implanting N-type or P-type impurities, using the gate electrode and the first and second sidewall spacers as a mask to form source/drain implants of an N-channel transistor or a P-channel transistor, respectively.

11. The method of claim 10, comprising:

implanting N-type impurities at an implantation dosage of about $5 \times 10^{14}$ atoms/cm$^2$ to about $5 \times 10^{15}$ atoms/cm$^2$ and an implantation energy of about 1 KeV to about 60 KeV to form the source/drain implants.

12. The method of claim 10, comprising:

implanting P-type impurities at an implantation dosage of about $5 \times 10^{14}$ atoms/cm$^2$ to about $5 \times 10^{15}$ atoms/cm$^2$ and an implantation energy of about 1 KeV to about 40 KeV to form the source/drain implants.

* * * * *